United States Patent
Verma

(10) Patent No.: US 10,360,332 B2
(45) Date of Patent: Jul. 23, 2019

(54) HANDLING BLIND STATEMENTS IN MIXED LANGUAGE ENVIRONMENTS

(71) Applicant: Mentor Graphics Corporation, Wilsonville, OR (US)

(72) Inventor: Gaurav Kumar Verma, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 477 days.

(21) Appl. No.: 14/549,242

(22) Filed: Nov. 20, 2014

(65) Prior Publication Data

US 2016/0147924 A1    May 26, 2016

(51) Int. Cl.
*G06F 17/50*    (2006.01)
(52) U.S. Cl.
CPC ................. *G06F 17/5045* (2013.01)
(58) Field of Classification Search
USPC .......................................................... 716/102
See application file for complete search history.

(56) References Cited

U.S. PATENT DOCUMENTS

2015/0008957 A1* 1/2015 Olgiati ............... G06F 17/5027
326/38

OTHER PUBLICATIONS

Pankaj Singh and Gaurav Kumar Verma, "A Step by Step Methodical Approach for Efficient Mixed-Language IP Integration," Design & Reuse, pp. 1-9, Mar. 27, 2010.

* cited by examiner

*Primary Examiner* — Eric D Lee
(74) *Attorney, Agent, or Firm* — Mentor Graphics Corporation

(57) ABSTRACT

This application discloses a computing system configured to determine that a first bind command is configured to prompt instantiation of an assertion module in a target module of a circuit design, which creates a mixed-language environment for the circuit design. The computing system, in response to the determination that the first bind command is configured to create the mixed-language environment for the circuit design, configured to generate a wrapper module configured to prompt instantiation of the assertion module in the wrapper module. The computing system configured to generate a second bind command configured to prompt instantiation of the wrapper module in the target module.

20 Claims, 5 Drawing Sheets

HANDLING BLIND STATEMENTS IN MIXED LANGUAGE ENVIRONMENTS

TECHNICAL FIELD

This application is generally related to electronic design automation and, more specifically, to handling bind statements in mixed language environments.

BACKGROUND

Designing and fabricating electronic systems typically involves many steps, known as a design flow. The particular steps of a design flow often are dependent upon the type of electronic system being designed, its complexity, the design team, and the fabricator or foundry that will manufacture the electronic system. The design flow typically starts with a specification for a new circuit, which can be transformed into a logical design. The logical design can model the circuit at a register transfer level (RTL), which is usually coded in a Hardware Design Language (HDL), such as System Verilog, Very high speed integrated circuit Hardware Design Language (VHDL), System C, or the like.

The logical design typically utilizes a design hierarchy to describe the circuit in terms of both the exchange of signals between hardware registers and the logical operations that can be performed on those signals. For example, when the circuit includes a processing system having multiple processing cores, rather than describe the entire processing system with each of the processing cores separately, i.e., in a flat representation, the logical design can describe a design unit for the processing core, which can be linked to multiple locations in a design unit for a processing system.

The typical technique for linking or interfacing the various design units is to include an instantiation statement in a higher-level design unit of the logical design, so that once design units have been compiled, the higher-level design unit can instantiate a lower-level design unit in response to execution of the instantiation statement. All too often, however, the inclusion of an instantiation statement in the higher-level design unit becomes impossible, as the higher-level design unit was purchased already-compiled with no access to the source code, or it may just be undesirable to modify the coding of the higher-level design unit. In these instances, the System Verilog hardware design language includes a bind command that can instantiate a lower-level design unit into a higher-level design unit without modifying the code of the higher-level design unit. The specific syntax of System Verilog bind commands and their associated usage can be found in of the IEEE Standard 1800-2005, section 17.15.

While these bind commands have become highly utilized, especially, to incorporate verification components into a logical design, they do have their limitations. For example, since the System Verilog hardware design language intends bind commands to be utilized in binding multiple System Verilog design units together, when the higher-level design unit is written is a different hardware design language, such as VHDL or System C, execution of the bind command creates a mixed language environment for the logical design. These mixed-language environments often do not support many of the features or expressions associated with bind commands, as the functionality associated with one hardware design language often differs from the functionality of a different hardware design language. This lack of full bind command functionality in mixed language environments often leads to errors during execution and re-design of the design units or the bind commands to ensure the design units properly interface after instantiation.

SUMMARY

This application discloses tools and mechanisms for implementing bind statements in a mixed language environment. According to various embodiments, the tools and mechanisms can determine that a first bind command is configured to prompt instantiation of an assertion module in a target module of a circuit design, which creates a mixed-language environment for the circuit design. The tools and mechanisms, in response to the determination that the first bind command is configured to create the mixed-language environment for the circuit design, can generate a wrapper module configured to prompt instantiation of the assertion module in the wrapper module. The tools and mechanisms can generate a second bind command configured to prompt instantiation of the wrapper module in the target module. Embodiments of implementing bind statements in a mixed language environment will be described in greater detail below.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
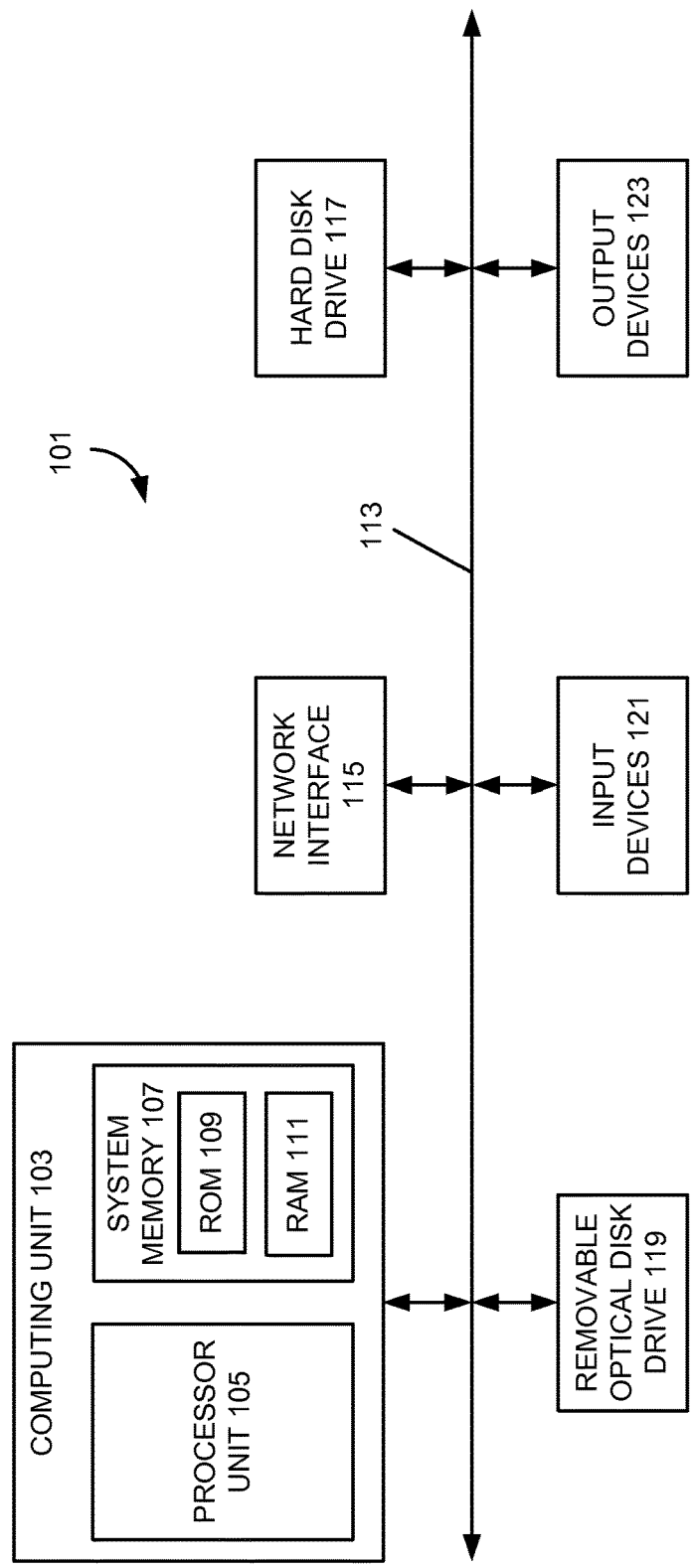
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
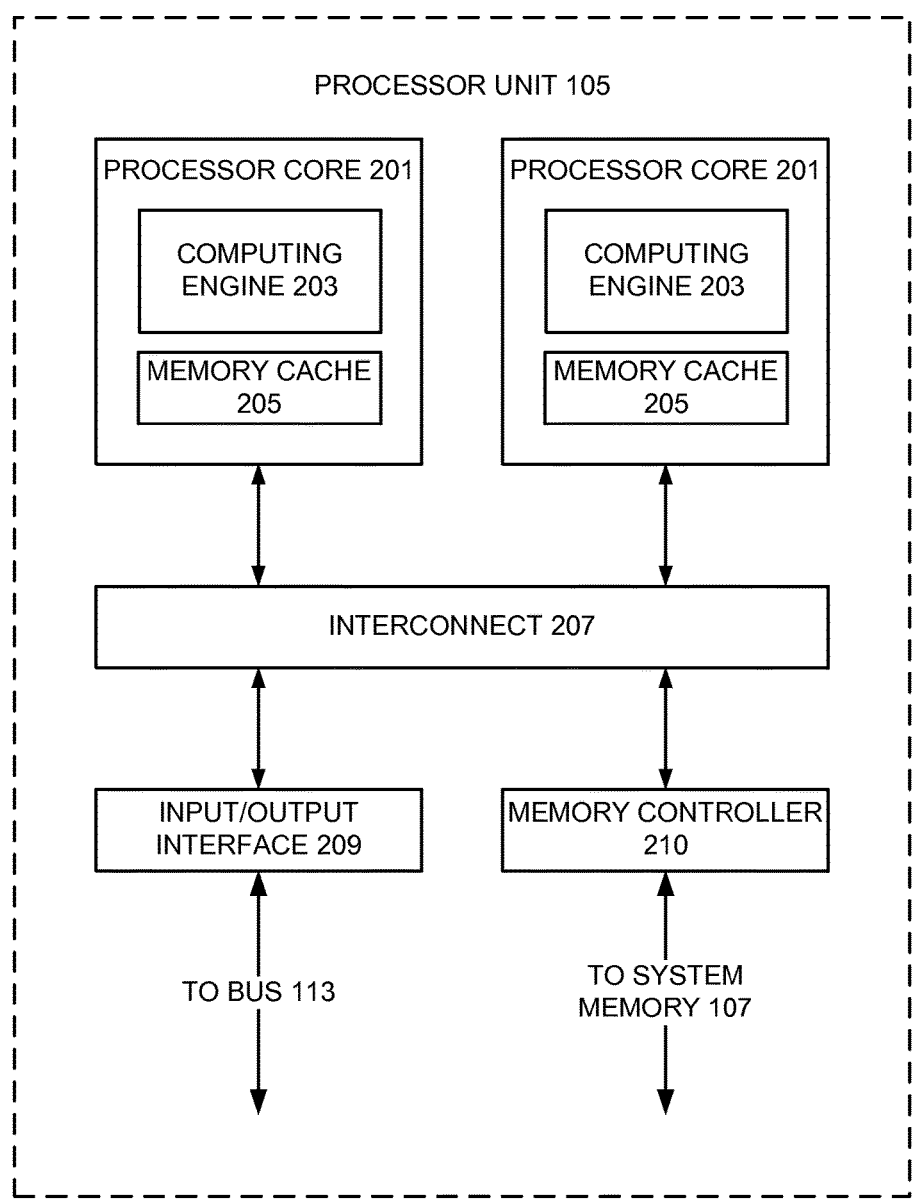

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Handling of Bind Statements in Mixed-Language Environments

Figure 3:
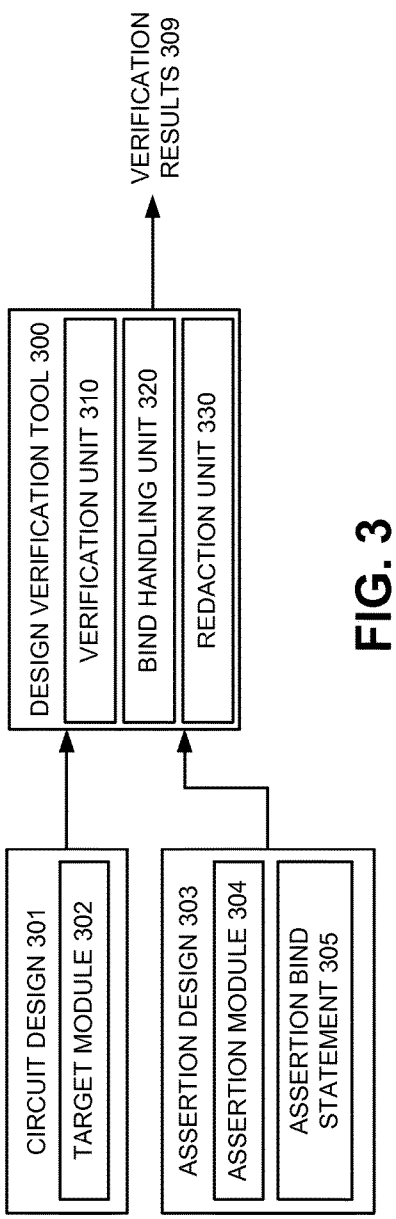
FIG. 3 illustrates an example of a design verification tool including a bind handling unit that may be implemented according to various embodiments of the invention.

FIG. 3 illustrates an example of a design verification tool 300 including a bind handling unit 310 that may be implemented according to various embodiments of the invention. Referring to FIG. 3, the design verification tool 300 can receive a circuit design 301, which can describe an electronic device both in terms of an exchange of data signals between components in the electronic device, such as hardware registers, flip-flops, combinational logic, or the like, and in terms of logical operations that can be performed on the data signals in the electronic device. The circuit design 301 can model the electronic device at a register transfer level (RTL), for example, with code in a hardware description language (HDL), such as Very high speed integrated circuit Hardware Design Language (VHDL), System C, or the like.

The design verification tool 300 also can receive an assertion design 303, which can describe assertion circuitry, for example, represented by an assertion module 304, both in terms of an exchange of data signals between components in the electronic device, such as hardware registers, flip-flops, combinational logic, or the like, and in terms of logical operations that can be performed on the data signals in the assertion circuitry.

The assertion design 303 can include an assertion bind statement 305 that, when executed, can cause the assertion module 304 to be instantiated in a target module 302 of the circuit design 301. The assertion bind statement 305 can have a syntax as described in the IEEE Standard 1800-2005, section 17.15, which is incorporated by reference herein. For example, the assertion bind statement 305 can include a bind command, a target scope, an assertion scope, an instantiation statement for the assertion scope, and, optionally, one or more identifiers to define which instance(s) of the target scope are to have the assertion scope instantiated according to the instantiation statement. The instantiation statement can be configured to have System Verilog syntax, for example, defining port and parameter actuals along with various System Verilog expressions.

The design verification tool 300 can include a verification unit 310 to perform verification operations, such as simulation or emulation, of the circuit design 301 and the assertion design 303. Although not shown in FIG. 3, the circuit design 301 and the assertion design 303 may be compiled based on their respective type of hardware description language and provided to the design verification tool 300 in a compiled format or the design verification tool 300 can compile the circuit design 301 and the assertion design 303 internally.

During the verification operations, if the verification unit 310 was allowed to execute the assertion bind statement 305 in the assertion design 303, the verification unit 310 would be prompted to directly instantiate the assertion module 304 in the target module 302 of the circuit design 301. Since the assertion module 304 and the target module 302 can be written in different hardware design languages, the instantiation of the assertion module 304 directly in the target module 302 can create a mixed language environment for the circuit design 301. As discussed above, since these mixed language environments cannot support a full range of bind or instantiation functionality, for example, eliminating the availability of many complex expressions supported by System Verilog, the assertion bind statement 305 would either prompt the design verification tool 300 to issue an error or be limited to basic bind or instantiation functionality. The design verification tool 300 can include a bind handling unit 320 to modify or convert the assertion design 303 into a format that can prompt the verification unit 310 to instantiate the assertion module 304 in the target module 302 of the circuit design 301 while supporting a full range of bind or instantiation functionality.

Figure 4:
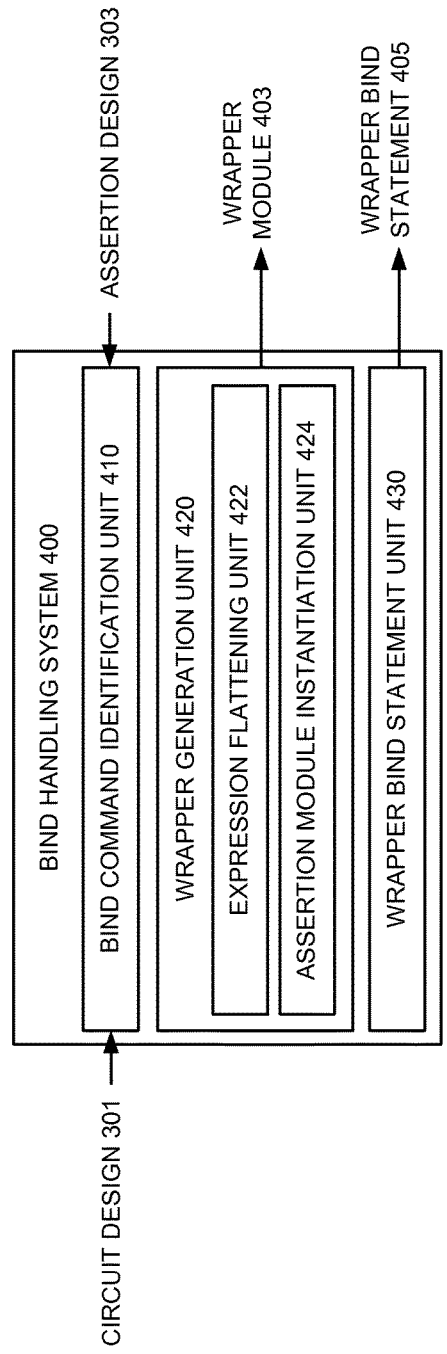
FIG. 4 illustrates an example bind handling system that may be implemented according to various embodiments of the invention.

FIG. 4 illustrates an example bind handling system 400 that may be implemented according to various embodiments of the invention. Referring to FIG. 4, the bind handling system 400 can receive the circuit design 301 and the assertion design 303. The bind handling system 400 can include a bind command identification unit 410 to parse the assertion design 303 and locate the presence of any bind statements, such as the assertion bind statement 305. The bind command identification unit 410 can analyze the target scope, such as the target module 302 in the circuit design 301, and the assertion scope, such as the assertion module 304, of the assertion bind statement 305 to determine whether execution of the assertion bind command 305 would cause a mixed language environment for the circuit design 301.

The bind handling system 400 can include a wrapper generation unit 420 that, in response to the bind command identification unit 410 identifying execution of the assertion bind statement 305 would create a mixed language environment for the circuit design 301, can generate a wrapper module 403 for instantiation of the assertion module 304. In some embodiments, the wrapper generation unit 420 can include an instantiation actual flattening unit 422 to traverse port and/or parameter actuals in the assertion bind statement 305 and collect any operands corresponding to the port and/or parameter actuals. The wrapper generation unit 420 can utilize the collected operands as ports and parameters for the wrapper module 403, which can interface the target module 302. Since the wrapper generation unit 420 utilizes the collected operands, rather than both operands and expressions, as ports and parameters for the wrapper module 403, the interface of the wrapper module 403 can be a flattened representation of the port and/or parameter actuals in the assertion bind statement 305.

The wrapper generation unit 420 can include assertion module instantiation unit 424 to generate an instantiation statement for the wrapper module 403 that, when executed, can prompt instantiation of the assertion module 304 in the wrapper module 403. The instantiation statement can have the same or similar actuals as provided in the assertion bind statement 305, which can allow the assertion module 304 to utilize the full range of instantiation functionality or expressions along with its port and/or parameter actuals.

The bind handling system 400 can include a wrapper bind statement unit 430 to generate a wrapper bind statement 405 to replace the assertion bind statement 305. The wrapper bind statement 405, when executed, can prompt the wrapper module 403 to be instantiated in the target module 302 of the circuit design 301. Since the wrapper module 403 has flattened port and/or parameter actuals, which are supported in the mixed language environment, the instantiated wrapper module 403 can appropriately interface with the target module 302, while the assertion module 304 instantiated in the wrapper module 403 retains full utilization of System Verilog expressions in the mixed language environment.

Referring back to FIG. 3, the design verification unit 310 can receive the wrapper module 403 and the wrapper bind statement 405 from the bind handling system 400. During verification operations, the verification unit 310 can execute the wrapper bind statement 405, which prompts the verification unit 310 to instantiate the wrapper module 403 in the target module 302. The verification unit 310 also can execute the instantiation statement in the wrapper module 403, which prompts the verification unit 310 to instantiate the assertion module 304 in the wrapper module 403. The verification unit 310 can then utilize the instantiated hierarchy of modules to perform verification operations and output verification results 309, which can be waveform data, circuit diagrams, test bench transactions, or the like.

In some embodiments, the design verification tool 300 can include a redaction unit 330 to prune the existence of the wrapper module 403 in the instantiated hierarchy of modules, so that the verification results 309 indicate the assertion module 304 was instantiated directly within the target module 302. This hiding of the presence of the wrapper module 403 can be performed in a variety of ways, for example, by removing the existence of the wrapper module 403 from an internal hierarchy tree and directly connecting the assertion module 304 to the target module 302. Since the design verification tool 300 can utilize the internal hierarchy tree to generate various reports in the verification results 309, the presence of the wrapper module 403 can be hidden from view or presentation by the design verification tool 300.

Figure 5:
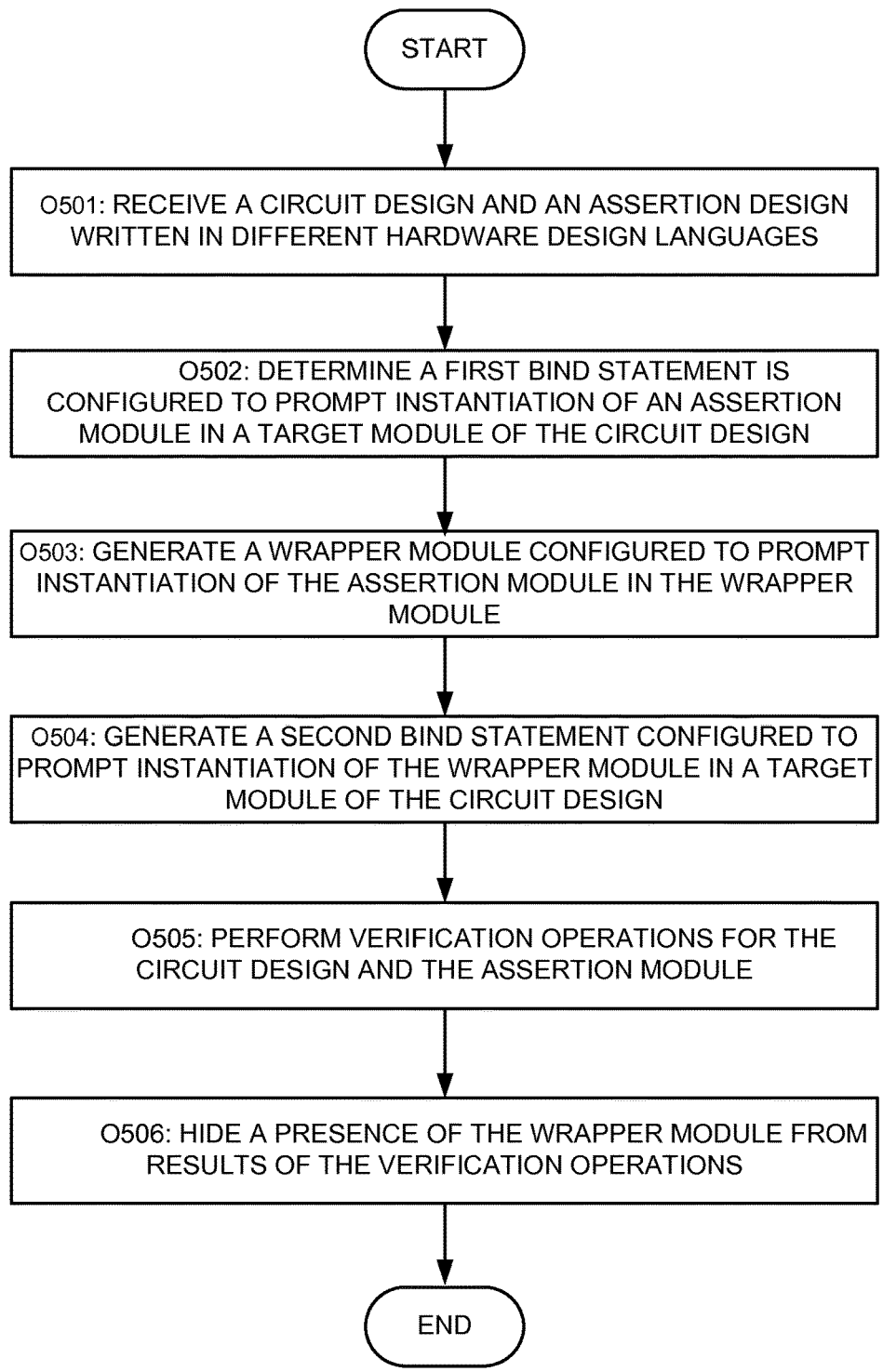
FIG. 5 illustrates a flowchart showing an example implementation of handling bind statements that prompt creation of a mixed-language environment for a circuit design according to various examples of the invention.

FIG. 5 illustrates a flowchart showing an example implementation of handling bind statements that prompt creation of a mixed-language environment for a circuit design according to various examples of the invention. Referring to FIG. 5, in a block 501, a computing system can receive a circuit design and an assertion design written in different hardware design languages. The circuit design can model an electronic device at a register transfer level (RTL), for example, with code in a hardware description language (HDL), such as Very high speed integrated circuit Hardware Design Language (VHDL), System C, or the like, while the assertion design can model assertion circuitry at a register transfer level (RTL), for example, with code in a System Verilog hardware design language.

In a block 502, the computing system can determine a first bind statement in the assertion design is configured to prompt instantiation of the assertion module in a target module of the circuit design, which creates a mixed-language environment for the circuit design. The computing system can parse the assertion design and locate the presence of any bind statements, such as the first bind statements. In some embodiments, the computing system can analyze the target scope, such as the target module in the circuit design, and the assertion scope, such as the assertion module, of the first bind statement to determine whether execution of the first bind statement would cause a mixed language environment for the circuit design.

In a block 503, the computing system can generate a wrapper module configured to prompt instantiation of the assertion module in the wrapper module. In some embodiments, the computing system can traverse port and/or parameter actuals in the first bind statement and collect any operands corresponding to the port and/or parameter actuals. The computing system can utilize the collected operands as ports and parameters for the wrapper module, which can interface the target module.

The computing system also can generate an instantiation statement for the wrapper module that, when executed, can prompt instantiation of the assertion module in the wrapper module. The instantiation statement can have the same or similar actuals as provided in the first bind statement, which can allow the assertion module to utilize the full range of instantiation functionality or expressions along with its port and/or parameter actuals.

In a block 504, the computing system can generate a second bind statement configured to prompt instantiation of the wrapper module in the target module. In some embodiments, the computing system can generate the second bind statement to replace the first bind statement. Since the wrapper module has flattened port and/or parameter actuals, which are supported in the mixed language environment, the instantiated wrapper module can appropriately interface with the target module, while the assertion module instantiated in the wrapper module retains full utilization of System Verilog expressions in the mixed language environment.

In a block 505, the computing system can perform verification operations for the circuit design and the assertion module. During verification operations, the computing system can execute the second bind statement, which prompts the computing system to instantiate the wrapper module in the target module. The computing system also can execute the instantiation statement in the wrapper module, which prompts the computing system to instantiate the assertion module in the wrapper module. The computing system can then utilize the instantiated hierarchy of modules to perform verification operations and output verification results, which can be waveform data, circuit diagrams, test bench transactions, or the like.

In a block 506, the computing system can hide a presence of the wrapper module from the results of the verification operations. As discussed above with reference to FIG. 3, the computing system can prune the existence of the wrapper module in the instantiated hierarchy of modules, so that the verification results indicate the assertion module was instantiated directly within the target module.

Figure 6:
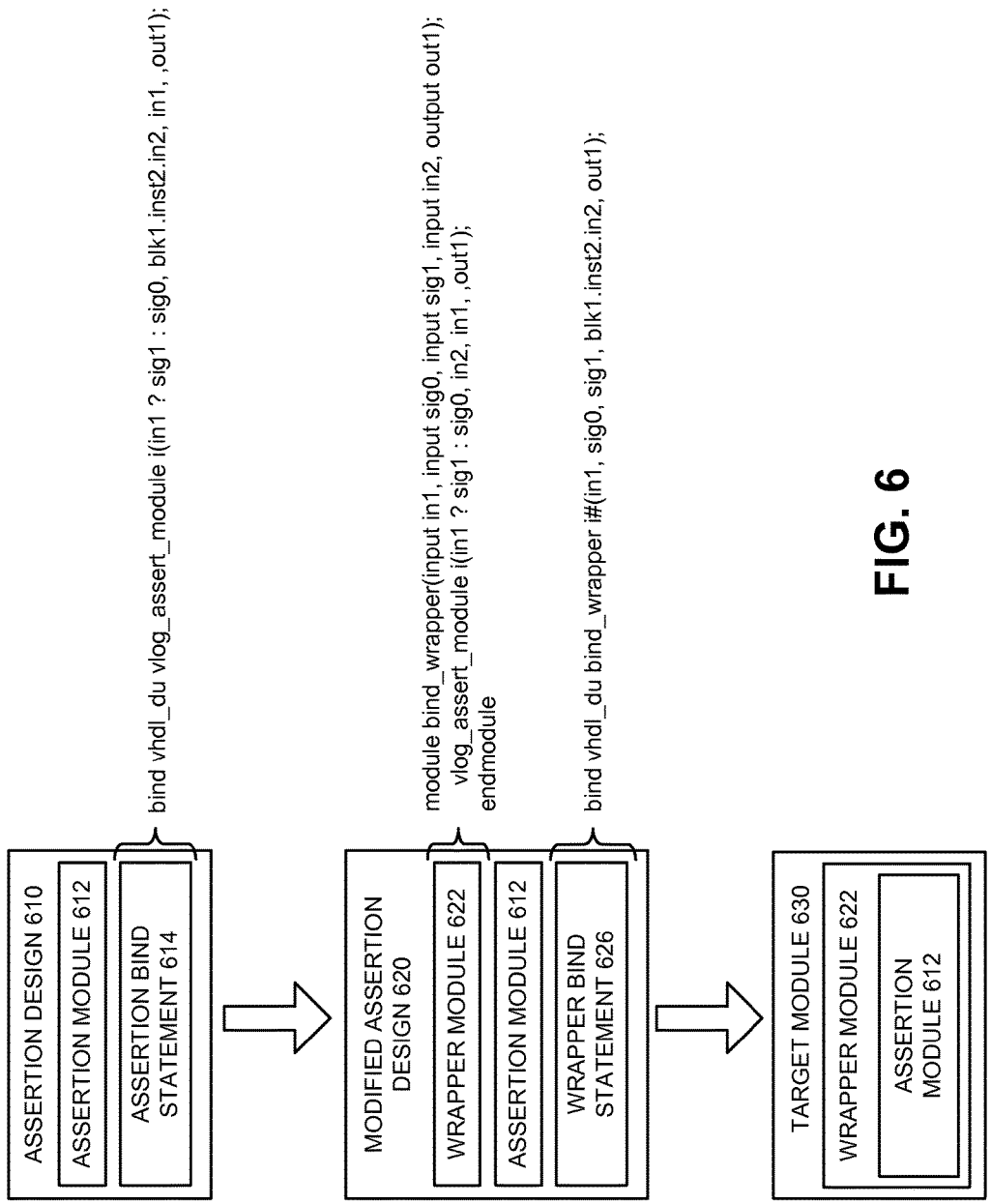
FIG. 6 illustrates an example implementation of bind statement handling according to various examples of the invention.

FIG. 6 illustrates an example implementation of bind statement handling according to various examples of the invention. Referring to FIG. 6, an assertion design 610 can include an assertion module 612, for example, describing assertion circuitry both in terms of an exchange of data signals between components in an electronic device, such as hardware registers, flip-flops, combinational logic, or the like, and in terms of logical operations that can be performed on the data signals in the assertion circuitry.

The assertion design 610 can include an assertion bind statement 614 that, when executed, can cause the assertion module 612 to be instantiated in a target module 630 of a circuit design. The assertion bind statement 614 can have a syntax as described in the IEEE Standard 1800-2005, section 17.15. An example of the assertion bind statement 614 can be "bind vhdl_du vlog_assert_module i(in1 ? sig1: sig0, blk1.inst2.in2, in1, out1);" with a bind command (bind), a target scope (vhdl_du) corresponding to a target module 630, an assertion scope (vlog_assert_module) corresponding to the assertion module 612, and an instantiation statement for the assertion scope (i(in1 ? sig1: sig0, blk1.inst2.in2, in1, out1)). The instantiation statement can be configured to have System Verilog syntax, for example, defining input and output port actuals along with various System Verilog expressions.

The bind statement handling implementation can generate a modified assertion design 620, which includes a wrapper module 622 having an instantiation statement that, when executed, can instantiate the assertion module 612 in the wrapper module 622. The instantiation statement can have the same or similar actuals as provided in the assertion bind statement 614, which can allow the assertion module 612 to utilize the full range of instantiation functionality or expressions along with its port and/or parameter actuals.

The wrapper module 622 can include port and parameter actuals that correspond to the operands (in1, sig1, sig0, in2, in1, out1) in the instantiation statement of the assertion bind statement 614. The instantiation statement of the wrapper module 622 can have the same or similar actuals as provided in the assertion bind statement 614, which can allow the assertion module 622 to utilize the full range of instantiation functionality or expressions along with its port and/or parameter actuals.

The bind statement handling implementation can generate a wrapper bind statement 626 to replace the assertion bind statement 614. An example of the wrapper bind statement 626 can be "bind vhdl_du bind_wrapper i#(in1, sig0, sig1, blk1.inst2.in2, out1);" with a bind command (bind), a target scope (vhdl_du) corresponding to the target module 630, an assertion scope (bind_wrapper) corresponding to the wrapper module 622, and an instantiation statement for the assertion scope (i#(in, sig0, sig1, blk1.inst2.in2, out1)).

The wrapper bind statement 626, when executed, can prompt the wrapper module 622 to be instantiated in the target module 630 of a circuit design. The instantiation statement in the wrapper module 622, when executed, can prompt instantiation of the assertion module 612 in the wrapper module 622. Since the wrapper module 622 has flattened port and/or parameter actuals, which are supported in the mixed language environment, the instantiated wrapper module 622 can appropriately interface with the target module 630, while the assertion module 612 instantiated in the wrapper module 622 retains full utilization of System Verilog expressions in the mixed language environment.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   determining, by a computing system, that a first bind statement is configured to prompt instantiation of an assertion module in a target module of a circuit design, which creates a mixed-language environment for the circuit design;
   in response to the determination that the first bind statement is configured to create the mixed-language environment for the circuit design, generating, by the computing system, a wrapper module configured to prompt instantiation of the assertion module in the wrapper module;
   generating, by the computing system, a second bind statement configured to prompt instantiation of the wrapper module in the target module; and
   performing, by the computing system, verification operations for the circuit design by executing the second bind statement to instantiate the wrapper module in the target module and instantiating the assertion module in the wrapper module in response to the instantiation of the wrapper module in the target module.

2. The method of claim 1, further comprising parsing, by the computing system, the first bind statement to identify operands in an instantiation statement of the first bind statement, wherein generating the wrapper module further comprises defining ports in the wrapper module that correspond to the operands identified in the instantiation statement of the first bind statement.

3. The method of claim 2, wherein the operands include port and parameter actuals in the instantiation statement of the first bind statement.

4. The method of claim 1, wherein the first bind statement is configured to prompt instantiation of the assertion module in the target module, while leaving code of the target module unmodified.

5. The method of claim 1, wherein the second bind statement is configured to prompt instantiation of the wrapper module in the target module, while leaving code of the target module unmodified.

6. The method of claim 1, wherein the mixed-language environment for the circuit design including the assertion module is coded in a System Verilog programming language and the target module is coded in a VHDL programming language.

7. The method of claim 1, further comprising hiding, by the computing system, a presence of the wrapper module having been instantiated in the target module in response to the second bind statement.

8. A system comprising:
a memory system configured to store computer-executable instructions; and
a computing system, in response to execution of the computer-executable instructions, is configured to:
determine that a first bind statement is configured to prompt instantiation of an assertion module in a target module of a circuit design, creating a mixed-language environment for the circuit design;
generate a wrapper module configured to prompt instantiation of the assertion module in the wrapper module;
generate a second bind statement configured to prompt instantiation of the wrapper module in the target module; and
perform verification operations for the circuit design by executing the second bind statement to instantiate the wrapper module in the target module and instantiating the assertion module in the wrapper module in response to the instantiation of the wrapper module in the target module.

9. The system of claim 8, wherein the computing system, in response to execution of the computer-executable instructions, is further configured to parse the first bind statement to identify operands in an instantiation statement of the first bind statement, wherein generating the wrapper module further comprises defining ports in the wrapper module that correspond to the operands identified in the instantiation statement of the first bind statement.

10. The system of claim 9, wherein the operands include port and parameter actuals in the instantiation statement of the first bind statement.

11. The system of claim 8, wherein the first bind statement is configured to prompt instantiation of the assertion module in the target module, while leaving code of the target module unmodified, and wherein the second bind statement is configured to prompt instantiation of the wrapper module in the target module, while leaving code of the target module unmodified.

12. The system of claim 8, wherein the mixed-language environment for the circuit design including the assertion module is coded in a System Verilog programming language and the target module is coded in a VHDL programming language.

13. The system of claim 8, wherein the computing system, in response to execution of the computer-executable instructions, is further configured to hide a presence of the wrapper module having been instantiated in the target module in response to the second bind statement.

14. An apparatus comprising at least one non-transitory computer-readable memory device storing instructions configured to cause one or more processing devices to perform operations comprising:
determining that a first bind statement is configured to prompt instantiation of an assertion module in a target module of a circuit design and create a mixed-language environment for the circuit design;
generating a wrapper module configured to prompt instantiation of the assertion module in the wrapper module;
generating a second bind statement that replaces the first bind statement, wherein the second bind command is configured to prompt instantiation of the wrapper module in the target module;
performing verification operations for the circuit design by executing the second bind statement to instantiate the wrapper module in the target module and instantiating the assertion module in the wrapper module in response to the instantiation of the wrapper module in the target module.

15. The apparatus of claim 14, wherein the instructions are configured to cause one or more processing devices to perform operations further comprising parsing the first bind statement to identify operands in an instantiation statement of the first bind statement, wherein generating the wrapper module further comprises defining ports in the wrapper module that correspond to the operands identified in the instantiation statement of the first bind statement.

16. The apparatus of claim 15, wherein the operands include port and parameter actuals in the instantiation statement of the first bind statement.

17. The apparatus of claim 14, wherein the first bind statement is configured to prompt instantiation of the assertion module in the target module, while leaving code of the target module unmodified.

18. The apparatus of claim 14, wherein the second bind statement is configured to prompt instantiation of the wrapper module in the target module, while leaving code of the target module unmodified.

19. The apparatus of claim 14, wherein the mixed-language environment for the circuit design including the assertion module is coded in a System Verilog programming language and the target module is coded in a VHDL programming language.

20. The apparatus of claim 14, wherein the instructions are configured to cause one or more processing devices to perform operations further comprising hiding a presence of the wrapper module having been instantiated in the target module in response to the second bind statement.

* * * * *